United States Patent
Souetinov et al.

(10) Patent No.: US 6,683,511 B2
(45) Date of Patent: Jan. 27, 2004

(54) CONTROLLABLE ATTENUATOR

(75) Inventors: Viatcheslav Igorevich Souetinov, Swindon (GB); Serguei Vedenine, Moscow (RU)

(73) Assignee: Zarlink Semiconductor Limited, Swindon (GB)

( * ) Notice: Subject to any disclaimer, the term of this patent is extended or adjusted under 35 U.S.C. 154(b) by 0 days.

(21) Appl. No.: 10/229,906

(22) Filed: Aug. 28, 2002

(65) Prior Publication Data

US 2003/0071697 A1 Apr. 17, 2003

(30) Foreign Application Priority Data

Aug. 30, 2001 (GB) .............................. 0121140

(51) Int. Cl.[7] .............................. H03H 7/24
(52) U.S. Cl. ................ 333/81 R; 330/284; 327/308
(58) Field of Search ..................... 333/81 R, 81 A, 333/262; 330/284; 327/308, 328

(56) References Cited

U.S. PATENT DOCUMENTS 3,902,077 A * 8/1975 Takemura et al. .......... 327/308
4,523,161 A * 6/1985 Miles ....................... 333/81 R
6,075,414 A * 6/2000 Nagaoka et al. ............ 330/284
6,147,568 A 11/2000 Souetinov
6,542,045 B2 * 4/2003 Nishibe ..................... 333/81 R

FOREIGN PATENT DOCUMENTS

GB 0121140 8/2001

OTHER PUBLICATIONS

"Reducing IM Distortion in CDMA Cellular", by Dick Bain, RF Design, Dec. 1996 pp. 46–53.
"A Direct Conversion Receiver for 900 MHz (ISM Band) Spead–Spectrum Digital Cordless Telephone", by Hull et al IEEE J. Solid–State Circuits, vol. 31, No. 12, 1996, pp. 1955–1963.

* cited by examiner

Primary Examiner—Brian Young
Assistant Examiner—John Nguyen
(74) Attorney, Agent, or Firm—Dority & Manning, P.A.

(57) ABSTRACT

A controllable attenuator has an input and an output, and comprises a first resistive element, a first capacitor connected in series between the input and the output, a first controllable shunting transistor connected between the output and a supply terminal via a second resistive element, and a controllable bypass transistor connected between the input and the output. The controllable attenuator may form part of a radio receiver circuit, the attenuator being positioned between a matching circuit and a low-noise amplifier.

25 Claims, 2 Drawing Sheets

CONTROLLABLE ATTENUATOR

CROSS-REFERENCE TO RELATED APPLICATIONS

The present application claims priority to currently pending United Kingdom Patent Application number 0121140.8, filed on Aug. 30, 2001.

STATEMENT REGARDING FEDERALLY SPONSORED RESEARCH OR DEVELOPMENT

BACKGROUND OF THE INVENTION

The present subject matter generally relates to a controllable attenuator for use in radio receivers and other electronic devices.

A controllable attenuator is often incorporated before a low noise amplifier (LNA) in the signal path of a radio receiver. Controllable attenuators may also be known as switchable or programmable attenuators. The usual effect of the attenuator is to improve the linearity characteristics and power handling capability of the receiver without increasing the noise figure or reducing the gain when the signal-to-noise figure ratio (SNR) is sufficiently high to be sacrificed without loss of information. One such attenuator is described in U.S. Pat. No. 6,147,568 and is shown schematically in FIG. 1.

Referring to FIG. 1, the attenuator 10 comprises a pair of bipolar, npn, transistors Q1 and Q2 which have their emitter/collector paths connected in reverse parallel between a point 1 in the radio-frequency signal input path and the signal return path G (shown as ground potential). A bias voltage is applied to the point 1 in the signal input path and thus to the interconnected collector electrode of transistor Q1 and emitter electrode of transistor Q2 by way of a high value resistor R2 from a voltage source Vr. The base electrodes of the transistors Q1 and Q2 are arranged to be biased individually by means of a bias control circuit 3. The point 1 in the input signal path is connected to the input of a low noise amplifier 2 by way of a coupling capacitor C1.

The transistors Q1, Q2, the control circuit 3, the capacitor C1 and the amplifier 2 may all be provided on an integrated circuit chip 4 in the radio-frequency signal path.

When the bias currents supplied by the control circuit 3 are zero, both transistors Q1 and Q2 are non-conducting, and the radio-frequency input signal is passed to the amplifier 2 without attenuation. When bias currents are supplied by the circuit 3, both the transistors Q1 and Q2 are saturated, and their small dynamic output impedance shunts the input signal to ground. The actual attenuation achieved depends upon the value of the shunt impedance.

The attenuator has two modes of operation: pre-set and variable. In the pre-set mode, the base bias currents are switched between zero and the respective values which provide the required pre-set value of attenuation. In the variable attenuation mode, the bias currents are varied either in steps or continuously to achieve the required attenuation variation.

Since the attenuator when switched off is not the source of any significant noise power, the transistors Q1 and Q2 each have as small an emitter area as possible for the required maximum attenuation, in order to limit noise flow from the substrate and the parasitic resistors (not shown). In this condition, the bias from the source Vr biases the junctions of the collector/base of Q1 and the emitter/base of Q2 to decrease the junction capacitances. The maximum value of this reverse bias voltage is limited by the maximum safe reverse voltage for the emitter/base junction of the transistor Q2. The value of the resistor R2 should be on the order of 10 kΩ or more to minimize its noise contribution.

When the attenuator is switched on, it is required to be very linear. Hence the two transistors Q1 and Q2 are in reverse parallel. The reverse parallel connection of the transistors Q1 and Q2 ensures that one of them is always in the "normal" sense of operation, while the other is operating in the inverse sense for any given polarity of radio-frequency input signal, making their combined dynamic output impedances much more linear over the range of voltages of interest.

The bases of the transistors Q1 and Q2 are biased independently because the transistor operating in the inverse sense has a lower input impedance and might "steal" the majority of the bias current if the bases were connected. The output impedance of the two transistors in parallel remains linear over at least + or −100 mV across the collector-emitter paths, and the shunting current can be as high as the bias current multiplied by the forward beta. This produces linear attenuation for input signal powers up to 3–10 dBm depending on the value of attenuation. The maximum input power can be increased if a small value resistor R3 is connected in series between the point 1 and the interconnected collector and emitter electrodes of the transistors Q1, Q2 respectively. This also improves the linearity of the attenuator 10 but, for the same maximum level of attenuation, the emitter and collector areas of the transistors Q1 and Q2 must be increased, together with the bias currents. At high frequencies, these larger areas result in higher noise flow from the substrate and the parasitic resistors.

For extending the range of attenuation it is possible to connect two or more attenuators 10 in parallel.

The FIG. 1 attenuator has the disadvantage that the input impedance of the receiver is dependent on the attenuation provided by the attenuator, which may cause matching problems.

A PIN diode attenuator, such as that described in "Reducing IM Distortion in CDMA Cellular", by Dick Bain, *RF Design*, December 1997, pages 46–53, requires a separate matching circuit, which occupies a large area on the printed board of the receiver. A gain controlled LNA, such as that disclosed in "A Direct Conversion Receiver for 900 MHz (ISM Band) Spead-Spectrum Digital Cordless Telephone", by Hull et al IEEE J. Solid-State Circuits, Vol. 31, No. 12, 1996, pages 1955–1963, can be integrated onto the receiver chip, but does not show improvements in linearity characteristics and power handling in direct proportion to the levels of attenuation.

OBJECTS AND SUMMARY OF THE INVENTION

Objects and advantages of the invention will be set forth in part in the following description, or may be obvious from the description, or may be learned through practice of the invention.

In accordance with aspects of the disclosed technology, it is an object of exemplary embodiments of the present subject matter to provide a controllable attenuator with improved linearity.

It is a further object of exemplary embodiments of the disclosed technology to provide a controllable attenuator that operates in multiple states and that maintains a generally stable input impedance independent of the operating states of the attenuator.

An exemplary embodiment of the present subject matter may correspond to a controllable attenuator having an input and an output. Such attenuator may preferably include a first resistive element and a first capacitor connected in series between the input and the output, a first controllable shunting transistor connected between the output and a supply terminal via a second resistive element, and a controllable bypass transistor connected between the input and the output.

Such exemplary controllable attenuator may further comprise a first controllable series transistor connected in series with the first resistive element, wherein the first series transistor is arranged to be switched in conjunction with the first shunting transistor.

Such exemplary controllable attenuator may further comprise a third resistive element and a second controllable series transistor connected in series between the input and the output, and a second controllable shunting transistor connected between the output and the supply terminal via a third resistive element. Such second series transistor is preferably arranged to be switched in conjunction with the second shunting transistor.

Exemplary controllable attenuator embodiments in accordance with the present subject matter may also include a second capacitor connected between the output and the first shunting transistor. Still further exemplary embodiments of the present technology may include a source of DC bias connected to the input.

Yet another exemplary embodiment of the present subject matter may relate to a radio receiver including a controllable attenuator having an input and an output and a low-noise amplifier configured to receive the output of the controllable attenuator. The controllable attenuator portion of such a radio receiver may preferably include a first resistive element and a first capacitor connected in series between the input and the output, a first controllable shunting transistor connected between the output and a supply terminal via a second resistive element, and a controllable bypass transistor connected between the input and the output.

A radio receiver embodiment in accordance with the disclosed technology may also include a matching circuit provided before the input of the controllable attenuator. An exemplary matching circuit corresponds to a capacitor and inductor connected in series.

The controllable attenuator of such exemplary radio receiver embodiment may further include a first controllable series transistor connected in series with the first resistive element, wherein the first series transistor is arranged to be switched in conjunction with the first shunting transistor. The controllable attenuator may further include a third resistive element and a second controllable series transistor connected in series between the input and the output, and a second controllable shunting transistor connected between the output and the supply terminal via a third resistive element. Such second series transistor is preferably arranged to be switched in conjunction with the second shunting transistor.

Exemplary radio receiver embodiments in accordance with the present subject matter may also incorporate into a controllable attenuator such components as a second capacitor connected between the output and the first shunting transistor. Still further exemplary embodiments of the present technology may include a source of DC bias connected to the input.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

Figure 1:
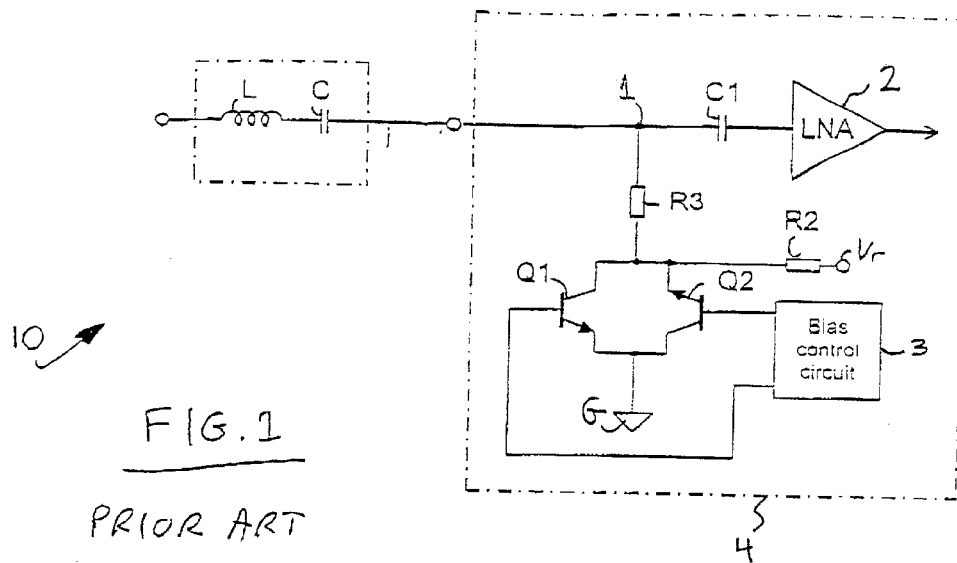
FIG. 1 provides a circuit schematic illustration of an exemplary known controllable attenuator configuration.

Repeat use of reference characters throughout the present specification and appended drawings is intended to represent same or analogous features or elements of the presently disclosed technology.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents.

Figure 2:
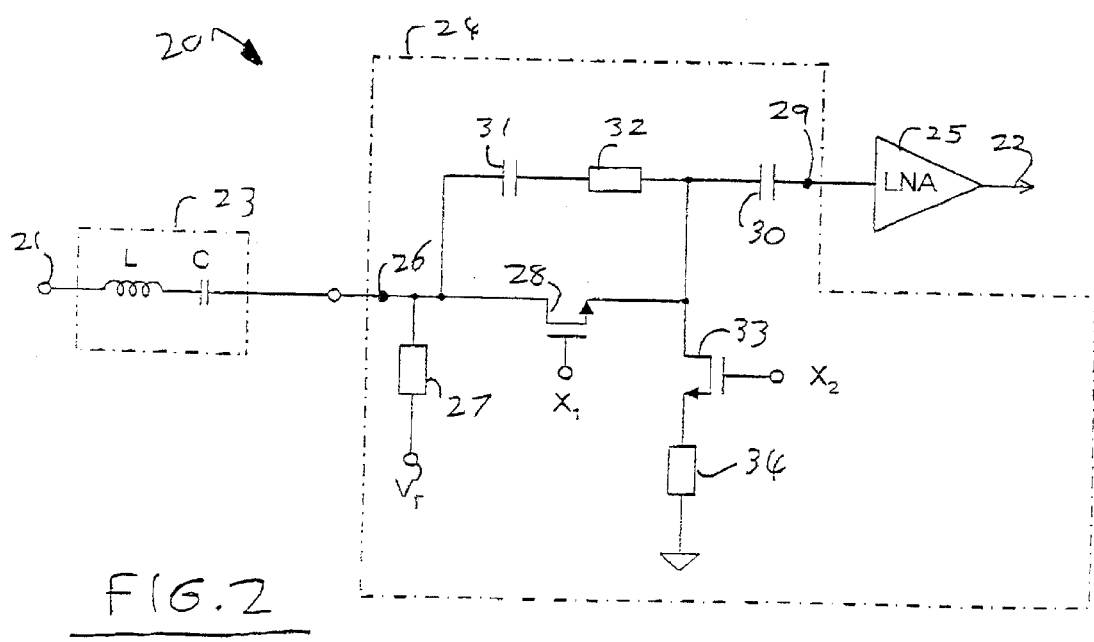
FIG. 2 provides a circuit schematic illustration of an exemplary radio receiver including an exemplary controllable attenuator in accordance with the present subject matter.

Referring to FIG. 2, a radio receiver circuit 20 is shown comprising, in series between an RF input 21 and an RF output 22, a matching circuit 23, a controllable attenuator circuit 24 and a low-noise amplifier (LNA) 25. The attenuator circuit 24 and the LNA 25 may be integrated onto a single chip, whereas the matching circuit 23 may be external. An input 26 of the attenuator circuit 24 is biased by connection to a voltage source Vr via a high value first resistor 27. A bypass N-type field-effect transistor 28 is connected between the input 26 and an output 29 of the attenuator 24 via a first capacitor 30. The capacitor 30 allows the LNA 25 and the attenuator 24 to be biased independently. A second capacitor 31 and a second resistor 32 are connected in series between the attenuator input 26 and the first capacitor 30. A first grounding transistor 33 is connected between a node formed at the connection of the second resistor 32 and the first capacitor 30 and ground potential via a third resistor 34. The impedance of the second capacitor 31 is approximately equal to the value of the imaginary part of the input impedance of the LNA 25. The capacitance of the first capacitor 30 is preferably much higher than the capacitance of the second capacitor 31. The sum of the resistances of the second resistor 32 and the third resistor 33 is approximately equal to the real part of the input impedance of the LNA 25. Operation of the attenuator circuit 24 is as follows.

When no attenuation is required, control signal $X_2$, applied to the gate electrode of the grounding transistor 33, is low and signal $X_1$, applied to the gate electrode of the bypass transistor 28, is high. This switches the grounding transistor 33 off, isolating the output 29 from ground, and switches the bypass transistor 28 on, which connects the input 26 to the output bypassing the second resistor 32. If the bypass transistor 28 is wide, the parasitic capacitance of its source and drain shunts the input signal and makes it susceptible to substrate noise. If it is narrow, however, its series resistance is high, which generates noise. The width of the bypass transistor 28 is selected as a compromise depending on the receiver with which it is used.

When attenuation is required, $X_1$ goes low and $X_2$ goes high. This switches the bypass transistor 28 off, resulting in the second resistor 32 becoming active insofar as it then attenuates signals received at the input. The grounding transistor 33 is switched on, which shunts part of the signal received at the input 26 to ground. In this condition, the value of attenuation provided is determined by the resistance of the second resistor 32 and by the ratio of the resistance of the second resistor to the resistance of the third resistor 34. The input impedance of the attenuator 24 is approximately the same regardless of whether or not the attenuator 24 is controlled to attenuate.

The attenuator 24 has two states, on and off. An attenuator having three states is shown in FIG. 3.

Figure 3:
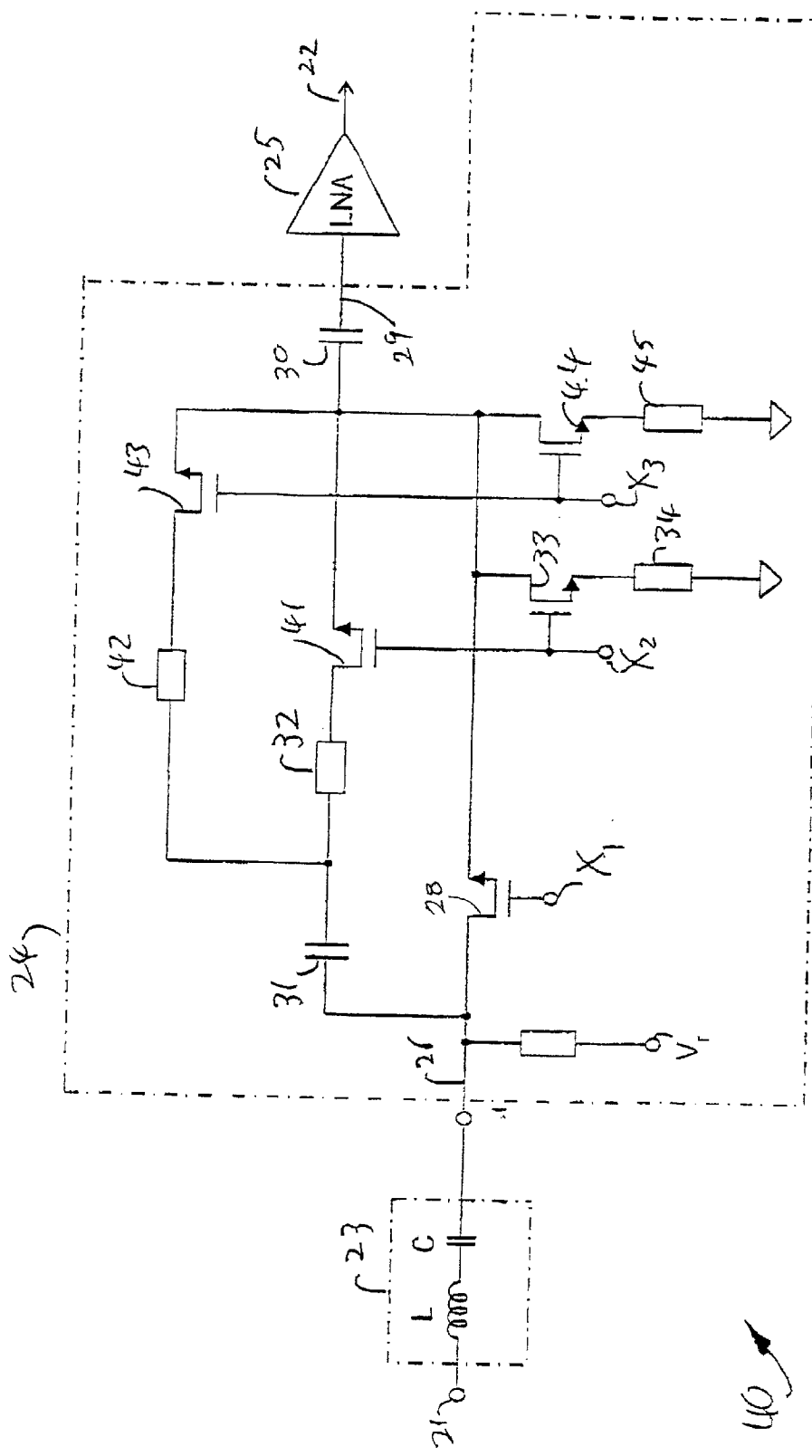
FIG. 3 provides a circuit schematic diagram of an exemplary radio receiver including an additional exemplary controllable attenuator in accordance with the present subject matter.

Referring to FIG. 3, a radio receiver 40 is shown, with reference numerals retained from the FIG. 2 radio receiver for like elements. Interposed between the second resistor 32 and the first capacitor 30 is a first series transistor 41, which has its gate electrode connected to receive the signal $X_2$. A fourth resistor 42 and a second series transistor 43 are connected in series between the second capacitor 31 and the first capacitor 30. A second grounding transistor 44 is connected between a node formed at the junction of the first and second series transistors 41, 43 and the first capacitor 30 and ground potential via a fifth resistor 45. The second series transistor 43 and the second grounding transistor 44 commonly receive a control signal $X_3$ at their gate electrodes.

With the FIG. 3 arrangement, when signal $X_2$ is high, the first series transistor 41 is switched on and the first grounding transistor is switched on. When signal $X_2$ is high, signals $X_1$ and $X_3$ are low. In this condition, the resistors 32 and 34 determine the amount of attenuation provided. As with the FIG. 2 arrangement, the sum of the resistances of these resistors 32, 34 is preferably approximately equal to the real part of the input impedance of the LNA 25.

The sum of the resistances of the resistors 42 and 45 is also preferably approximately equal to the real part of the input impedance of the LNA 25. However, the values of these resistors are different than the values of the resistors 32 and 34. In this way, provision of a high signal $X_3$ and low signals $X_1$ and $X_2$, which results in the resistor 42 being active in the path between the input and the output, results in a different degree of attenuation yet the input impedance of the attenuator 24 is substantially unchanged. When no attenuation is required, a high signal $X_1$ and low signals $X_2$ and $X_3$ are provided.

The FIG. 3 attenuator thus provides three different levels of attenuation. Further levels may be provided by including still further stages, as will be appreciated by those skilled in the art. If a high level of attenuation is required by one such stage, the grounding transistor of that stage may be connected directly to ground, i.e., its resistor may be omitted. Attenuators having two or more attenuation levels may be described as programmable, controllable or switchable.

In certain circumstances, the bias voltage Vr can be set to zero volts, or ground, which allows the attenuator 24 to be used without a DC current supply in any operating state.

The noise figure of a circuit constructed with the attenuator 24 may be improved through the use of capacitors which are shielded from the substrate on which they are formed.

Although the embodiments disclosed herein use field-effect transistors, it should be appreciated that the invention may also be implemented using bipolar transistors or other appropriately configured transistor elements.

While at least one presently preferred embodiment of the invention has been described using specific terms, such description is for illustrative purposes only, and it is to be understood that changes and variations may be made without departing from the spirit or scope of the following claims.

What is claimed is:

1. A controllable attenuator having an input and an output, the attenuator comprising:

a first resistive element and a first capacitor connected in series between the input and the output;

a first controllable shunting transistor connected between the output and a supply terminal via a second resistive element; and a controllable bypass transistor connected between the input and the output.

2. A controllable attenuator as claimed in claim 1, further comprising a first controllable series transistor connected in series with the first resistive element, the first series transistor being arranged to be switched in conjunction with the first shunting transistor.

3. A controllable attenuator as claimed in claim 1, further comprising a third resistive element and a second controllable series transistor connected in series between the input and the output, and a second controllable shunting transistor connected between the output and the supply terminal via a third resistive element, the second series transistor being arranged to be switched in conjunction with the second shunting transistor.

4. A controllable attenuator as claimed in claim 2, further comprising a third resistive element and a second controllable series transistor connected in series between the input and the output, and a second controllable shunting transistor connected between the output and the supply terminal via a third resistive element, the second series transistor being arranged to be switched in conjunction with the second shunting transistor.

5. A controllable attenuator as claimed in claim 1, further comprising a second capacitor connected between the output and the first shunting transistor.

6. A controllable attenuator as claimed in claim 2, further comprising a second capacitor connected between the output and the first shunting transistor.

7. A controllable attenuator as claimed in claim 3, further comprising a second capacitor connected between the output and the first shunting transistor.

8. A controllable attenuator as claimed in claim 4, further comprising a second capacitor connected between the output and the first shunting transistor.

9. A controllable attenuator as claimed in claim 1, further comprising a source of DC bias connected to the input.

10. A controllable attenuator as claimed in claim 2, further comprising a source of DC bias connected to the input.

11. A controllable attenuator as claimed in claim 3, further comprising a source of DC bias connected to the input.

12. A controllable attenuator as claimed in claim 4, further comprising a source of DC bias connected to the input.

13. A controllable attenuator as claimed in claim 5, further comprising a source of DC bias connected to the input.

14. A controllable attenuator as claimed in claim 6, further comprising a source of DC bias connected to the input.

15. A controllable attenuator as claimed in claim 7, further comprising a source of DC bias connected to the input.

16. A controllable attenuator as claimed in claim 8, further comprising a source of DC bias connected to the input.

17. A radio receiver comprising:
   a controllable attenuator having an input and an output, said attenuator comprising:
      a first resistive element and a first capacitor connected in series between the input and the output;
      a first controllable shunting transistor connected between the output and a supply terminal via a second resistive element; and
      a controllable bypass transistor connected between the input and the output; and
   a low-noise amplifier configured to receive the output of said controllable attenuator.

18. A radio receiver as in claim 17, further comprising a matching circuit provided before the input of said controllable attenuator, said matching circuit comprising an inductor and capacitor connected in series.

19. A radio receiver as in claim 17, further comprising a first controllable series transistor connected in series with the first resistive element, the first series transistor being arranged to be switched in conjunction with the first shunting transistor.

20. A radio receiver as in claim 17, further comprising a third resistive element and a second controllable series transistor connected in series between the input and the output, and a second controllable shunting transistor connected between the output and the supply terminal via a third resistive element, the second series transistor being arranged to be switched in conjunction with the second shunting transistor.

21. A radio receiver as in claim 17, further comprising a second capacitor connected between the output and the first shunting transistor.

22. A radio receiver as in claim 17, further comprising a source of DC bias connected to the input.

23. A radio receiver as in claim 17, further comprising:
   a first controllable series transistor connected in series with the first resistive element, the first series transistor being arranged to be switched in conjunction with the first shunting transistor;
   a third resistive element and a second controllable series transistor connected in series between the input and the output, and a second controllable shunting transistor connected between the output and the supply terminal via a third resistive element, the second series transistor being arranged to be switched in conjunction with the second shunting transistor; and
   a second capacitor connected between the output and the first shunting transistor.

24. A radio receiver as in claim 23, further comprising a source of DC bias connected to the input.

25. A radio receiver as in claim 23, further comprising a matching circuit provided before the input of said controllable attenuator, said matching circuit comprising an inductor and capacitor connected in series.

* * * * *